(12) United States Patent
Ditto et al.

(10) Patent No.: US 9,425,799 B2
(45) Date of Patent: Aug. 23, 2016

(54) RECONFIGURABLE LOGIC GATES USING CHAOTIC DYNAMICS

(71) Applicant: University of Hawaii, Honolulu, HI (US)

(72) Inventors: William Ditto, Kaneohe, HI (US); Behnam Kia, Honolulu, HI (US)

(73) Assignee: University of Hawaii, Honolulu, HI (US)

( * ) Notice: Subject to any disclaimer, the term of this patent is extended or adjusted under 35 U.S.C. 154(b) by 0 days.

(21) Appl. No.: 14/640,342

(22) Filed: Mar. 6, 2015

(65) Prior Publication Data

US 2016/0087634 A1  Mar. 24, 2016

Related U.S. Application Data

(60) Provisional application No. 61/948,121, filed on Mar. 5, 2014.

(51) Int. Cl.
*H03M 1/12* (2006.01)
*H03K 19/177* (2006.01)
*H03M 1/34* (2006.01)

(52) U.S. Cl.
CPC .... *H03K 19/17728* (2013.01); *H03K 19/17744* (2013.01); *H03M 1/34* (2013.01)

(58) Field of Classification Search
CPC .............. H03M 1/34; H03K 19/17744; H03K 19/17728; H03K 3/84; H03K 3/0231; H04L 9/00; H04L 9/12; H04L 9/001; H04L 9/0662; H04L 9/0668; H04L 27/00; H04L 27/001; G06F 7/588; H04B 1/0458
USPC ................... 341/130–160; 327/197; 375/216; 455/121, 129, 91; 380/263, 46, 268, 380/28, 277
See application file for complete search history.

(56) References Cited

U.S. PATENT DOCUMENTS 5,522,863 A * 6/1996 Spano ................. A61N 1/3621
                                                    128/925
5,680,462 A * 10/1997 Miller ..................... H04L 9/001
                                                    380/263

(Continued)

*Primary Examiner* — Lam T Mai
(74) *Attorney, Agent, or Firm* — Baker & Hostetler LLP

(57) ABSTRACT

The present invention provides apparatuses and methods for chaos computing. For example, a chaos-based logic block comprises an encoding circuit block, at least one chaotic circuit block, a bias voltage generating circuit block, and a threshold circuit block. The encoding circuit block converts a plurality of digital inputs to an analog output. The plurality of digital inputs may comprise at least one data input and at least one control input. At least one chaotic circuit block is configured to iterate converting an input signal to an output signal by feeding the output signal to at least one chaotic circuit as the input signal at each iteration. The bias voltage generating circuit block converts a plurality of binary control inputs to a bias voltage. The threshold circuit block compares the output signal with a predetermined threshold, thereby generating a digital signal.

10 Claims, 15 Drawing Sheets

(56) References Cited

U.S. PATENT DOCUMENTS

| | | | | |
|---|---|---|---|---|
| 5,751,811 A * | 5/1998 | Magnotti | H04L 9/0662 | 380/28 |
| 5,914,827 A * | 6/1999 | Yamasaki | G11B 20/182 | 360/27 |
| 6,128,973 A * | 10/2000 | Nagano | B62M 3/086 | 403/24 |
| 6,253,068 B1 * | 6/2001 | Elder | H04B 1/04 | 455/121 |
| 6,442,271 B1 * | 8/2002 | Tuttle | H04L 25/0266 | 379/399.01 |
| 6,842,745 B2 * | 1/2005 | Occhipinti | H04L 27/001 | 327/94 |
| 7,072,469 B1 * | 7/2006 | Oudaltsov | H04L 9/001 | 380/263 |
| 8,917,871 B2 * | 12/2014 | Wang | | 380/277 |
| 9,064,091 B2 * | 6/2015 | Ditto | | G06F 15/76 |
| 2008/0107268 A1 * | 5/2008 | Rohde | H04L 9/001 | 380/263 |
| 2013/0106481 A1 * | 5/2013 | Campos Canton | H03K 3/84 | 327/197 |

\* cited by examiner

RECONFIGURABLE LOGIC GATES USING CHAOTIC DYNAMICS

CROSS REFERENCE TO RELATED APPLICATION

This application claims benefit of U.S. Provisional Application No. 61/948,121 filed Mar. 5, 2014. The content of that application are hereby incorporated by reference herein.

GOVERNMENT RIGHTS

This invention was made with government support under grant numbers STTR-N00014-14-C-0033 and N00014-12-1-0026 awarded by the Office of Naval Research. The Government has certain rights in the invention.

FIELD OF THE INVENTION

The disclosed invention is in the field of chaos computing.

BACKGROUND OF THE INVENTION

Nonlinear, chaotic systems may possess very rich dynamics containing many different behaviors. All of these different behaviors can coexist within the same systems. As an example, a simple nonlinear circuit that can be constructed using a few transistors illustrates a rich library of different behaviors. These different behaviors within the chaotic dynamics can be utilized to implement different digital functions. This means that the same circuit can implement different operations such as AND, XOR, NOR, etc. However, there are practical difficulties in implementing these chaotic dynamics with conventional chaotic computing modules such as operational amplifiers or analog multiplier. Specifically, considering that the aim is to implement simple logic operations, it is not efficient to have a large circuit board with dozen of complex components such as operational amplifiers. Furthermore, the conventional chaotic computing modules are programmed with analog values to implement a digital function. This means that the module is not fully compatible with other digital components to cascade with or connect to. Therefore, there is a need for devices and methods that will efficiently perform different computational tasks with few, simple electrical components.

SUMMARY OF THE INVENTION

The present invention provides chaos-based logic blocks for chaos computing, comprising an encoding circuit block converting a plurality of digital inputs to an analog output, the plurality of digital inputs comprising at least one data input and at least one control input; at least one chaotic circuit block coupled to the encoding circuit block, the at least one chaotic circuit block is configured to iterate converting an input signal to an output signal by feeding the output signal to the at least one chaotic circuit as the input signal at each iteration; a bias voltage generating circuit block coupled to the at least one chaotic circuit block, converting a plurality of binary control inputs to a bias voltage; and a threshold circuit block coupled to the at least one chaotic circuit block, comparing the output signal with a predetermined threshold to generate a digital signal.

The present invention provides methods for chaos computing, comprising converting, at an encoding circuit block, a plurality of digital inputs to an analog output, the plurality of digital inputs comprising at least one data input and at least one control input; converting, at a bias voltage generating circuit block, a plurality of binary control inputs to a bias voltage; converting, by at least one chaotic circuit block, an input signal to an output signal by feeding the output signal to the at least one chaotic circuit as the input signal at each iteration; determining the output signal by performing circuit operations comprising at least one of changing the at least one control input of the encoding circuit block, changing a number of the each iteration at the at least one chaotic circuit block, or changing the plurality of binary control inputs at the bias voltage generating circuit block; and comparing, at a threshold circuit block, the output signal with a predetermined threshold to generate a digital signal.

The general description and the following detailed description are exemplary and explanatory only and are not restrictive of the invention, as defined in the appended claims. Other aspects of the present invention will be apparent to those skilled in the art in view of the detailed description of the invention as provided herein.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings.

DETAILED DESCRIPTION OF ILLUSTRATIVE EMBODIMENTS

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, references to values stated in ranges include each and every value within that range.

Chaotic systems may contain an infinite number of unstable periodic orbits or patterns, and many of these orbits or patterns can be engineered to construct morphable digital logic gates and combination of gates. For example, a VLSI electronic circuit based upon chaotic dynamics can utilize the principals of chaotic dynamics to implement different operations. This means that the chaotic circuit can be dynamically programmed to implement different types of functions. In addition, the chaotic circuit can perform two distinct logic operations in parallel in one clock cycle. Those different types of functions or different operations can be implemented by the chaotic circuits with a minimal number of transistors.

Figure 1:
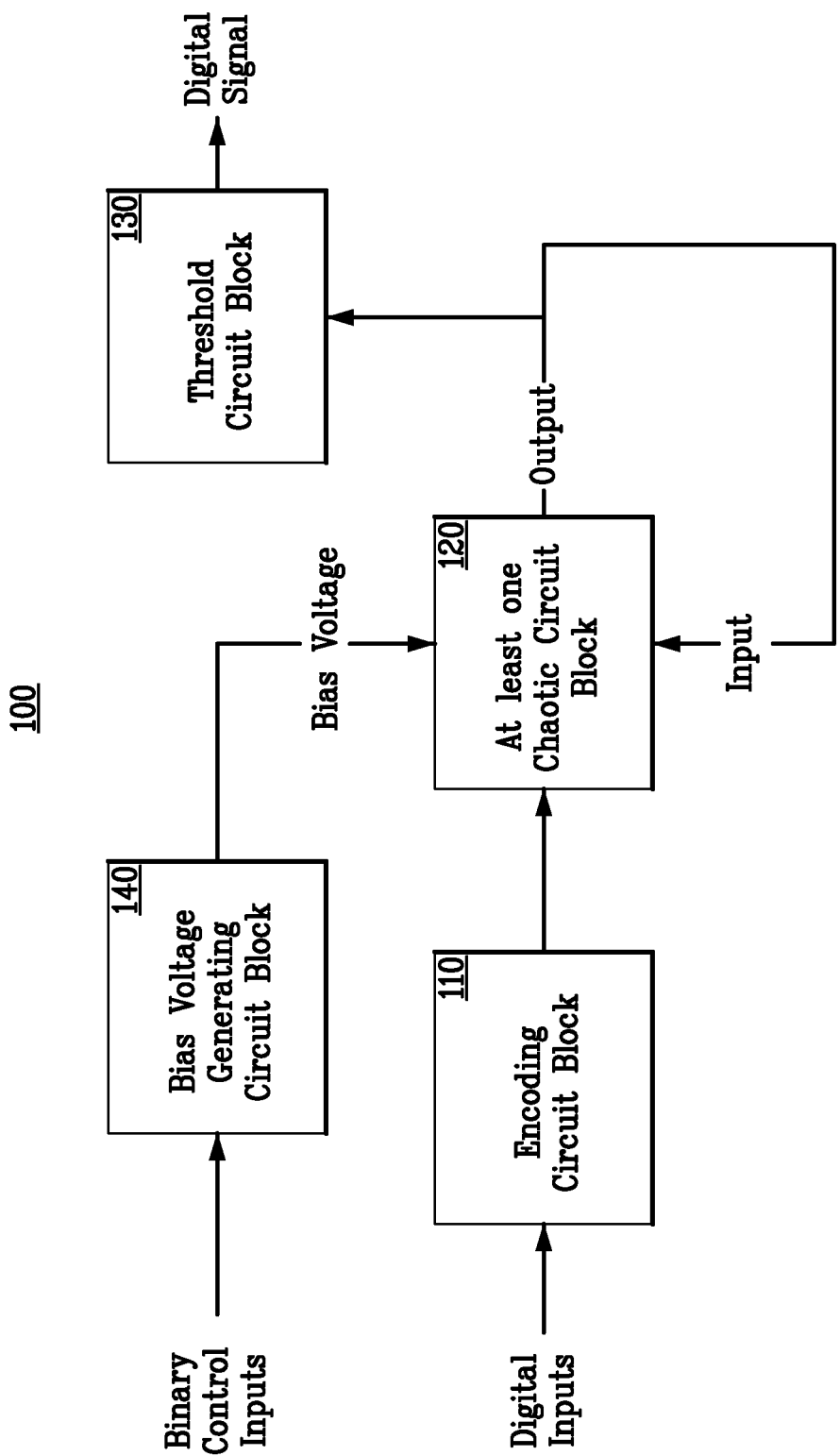
FIG. 1 is a block diagram illustrating high level circuit architecture for a chaos-based logic block in accordance with an embodiment.

FIG. 1 illustrates high level circuit architecture for the chaos-based logic block in accordance with an embodiment. The chaos-based logic block 100 can be an electronic circuit based upon chaotic dynamics. It can also comprise an encoding circuit block 110, at least one chaotic circuit block 120, a bias voltage generating circuit block 140, and a threshold circuit block 130.

The encoding circuit block 110 can convert a plurality of digital inputs to an analog output. The encoding circuit block 110 can also produces an initial condition for at least one chaotic circuit block 120. With the analog output, at least one chaotic circuit block 120 can be initialized. The analog output can be a weighted sum of the plurality of digital inputs. The plurality of digital inputs can comprise at least one data input and at least one control input. Using at least one control input, the chaos-based logic block 100 can be programmed to perform different types of operations. Specifically, at least one control input can change the analog output of the encoding circuit block 110. The changed analog output can be used as an initial condition of at least one chaotic circuit block 120. Because the initial condition is changed, a chaotic evolution of at least one chaotic circuit block 120 can be changed. As a result, at least one chaotic circuit block 120 can produce different types of operations.

The encoding circuit block 110 can be a digital to analog convertor, but it is not limited to an exact, perfect digital to analog converter. Any encoder that maps digital values to an analog value can be used as the encoding circuit block 110. Such an encoder can be efficient if the mapped analog values are equally spaced.

As illustrated in FIG. 1, at least one chaotic circuit block 120 can be configured to iterate converting an input signal to an output signal by feeding the output signal to at least one chaotic circuit block as the input signal at each iteration. Specifically, at least one chaotic circuit block 120 can build an iterated chaotic system. In the iterated chaotic system, a chaotic circuit block maps an input signal to the output signal. And then, the output signal is fed back to the same chaotic circuit block by a feedback mechanism. For example, at a first iteration, x0 is mapped to x1 and x1 is fed back to the same chaotic block, thereby producing x2 as its result. Here, the index represents the time step.

At least one chaotic circuit block 120 can form any number of interconnected or chained chaotic circuit blocks. For example, two chaotic circuit blocks can be interconnected each other to perform two parallel computations at each step. The two chaotic circuit blocks can have the same circuit, but it can have different circuit as well. When the two chaotic circuit blocks form the loop, the result at the first iteration is x0 and x1, and at the second iteration, x2 and x3. Although the chaos-based logic block 100 can be implemented with a single chaotic circuit block, the additional chaotic block can expedite the evolution of chaotic iterations by a factor of two. Since chaotic evolution performs logical computations, the two interconnected chaotic circuit blocks can perform two parallel computations at each iteration.

In an embodiment, at least one chaotic circuit block 120 can form a lattice of chaotic circuit blocks to operate a high performance mode or a robust mode. In a high performance mode, each of the chaotic circuit blocks becomes independent and uncoupled. The uncoupled chaotic circuit blocks can operate each other in parallel while implementing different operations. In a robust mode, when noise level increases due to certain reasons, the chaotic circuit blocks can be coupled each other, thereby implementing a robust computation together.

For example, when an aerospace system is exposed to high noise radiations, the lattice of chaotic circuit blocks can be programmed to operate at the robust mode, which enables the computing system operate at higher noise immunity levels at the expense of a small of reduction in functionality of the dynamic computing system. When the noise level returns to a normal or low level, the lattice of chaotic circuit blocks can be reprogrammed to operate at a high performance mode. With the coupled chaotic circuit blocks, a computing system can implement adjustable noise immunity level that is programmed based on the operating condition of the computing system.

The bias voltage generating circuit block 140 coupled to the at least one chaotic circuit block 120, can convert a plurality of binary control inputs to a bias voltage. This bias voltage can change the shape of chaotic map, thereby programming at least one chaotic circuit block 120 to perform desired computations. For example, a simple electronic circuit to generate a bias voltage maps two binary control inputs to a bias voltage. The two control inputs can change the value of bias voltage. As a result, at least one chaotic circuit block 120 can produce different output signals.

The threshold circuit block 130 coupled to at least one chaotic circuit block 120, can compare the output signal with a predetermined threshold to generate a digital signal. For example, if the output signals by at least one chaotic circuit block 120 are less than the predetermined threshold value, the threshold circuit block 130 can assign a digital signal "1" for the output signals. If the output signals by at least one chaotic circuit block 120 are higher than the predetermined threshold value, the threshold circuit block 130 can assign a digital signal "0" for the output signals. The output signals of at least one chaotic circuit block 120 can represent the output state of a chaotic map. To assign digital signal "0" or "1" to the output state of the chaotic map, the state space of the map can be divided into two parts, and each part is assigned a digital signal "0" or "1". This means that the threshold circuit block 130 can produce the digital signal "0" or "1" based on at which part the output signal of the chaotic map is located.

The threshold circuit block 130 can be an analog to digital converter, but it is not limited to an exact, perfect analog to digital converter. Any comparator that compares a final value with a threshold and produce a symbol "1" or "0" can be the threshold circuit block 130. For example, a 1-bit analog to digital converter can form the threshold circuit block 130.

In an embodiment, at least one switch can be coupled to at least one chaotic circuit block 120 to regulate the flow of the signal. Specifically, a first and second switch coupled to a first and second chaotic circuit block respectively can control the input signals at the first and second chaotic circuit block. In order to maintain a stable flow of signals between the first and second chaotic circuit block, the first and second switch can alternately turn on and off at each iteration. For example, when the first switch is open, the second switch is closed, and vice versa. This allows a stable flow of signals between the chaotic maps, thereby resulting two chaotic orbits. One is from the first chaotic map and the other is from the second chaotic map. Because two chaotic evolutions are generated, the chaos-based logic block 100 can perform two parallel computations at each step.

In an embodiment, the chaos-based logic block 100 can be extended to implement three-input (or higher number of input) and one output digital functions by increasing the digital lines to the encoding circuit block 110. The chaos-based logic block 100 can be also extended to implement digital functions with more than one output by increasing the digital output lines of the threshold circuit block 130.

In another embodiment, the chaos-based logic block 100 can perform all of computational tasks described herein with very few transistors. It is because the chaos-based logic block 100 can utilize the inherent, intrinsic complex dynamics of nonlinear systems to implement multiple functions, rather than directly implementing different functions separately and switching between them based on what is needed.

Figure 2:
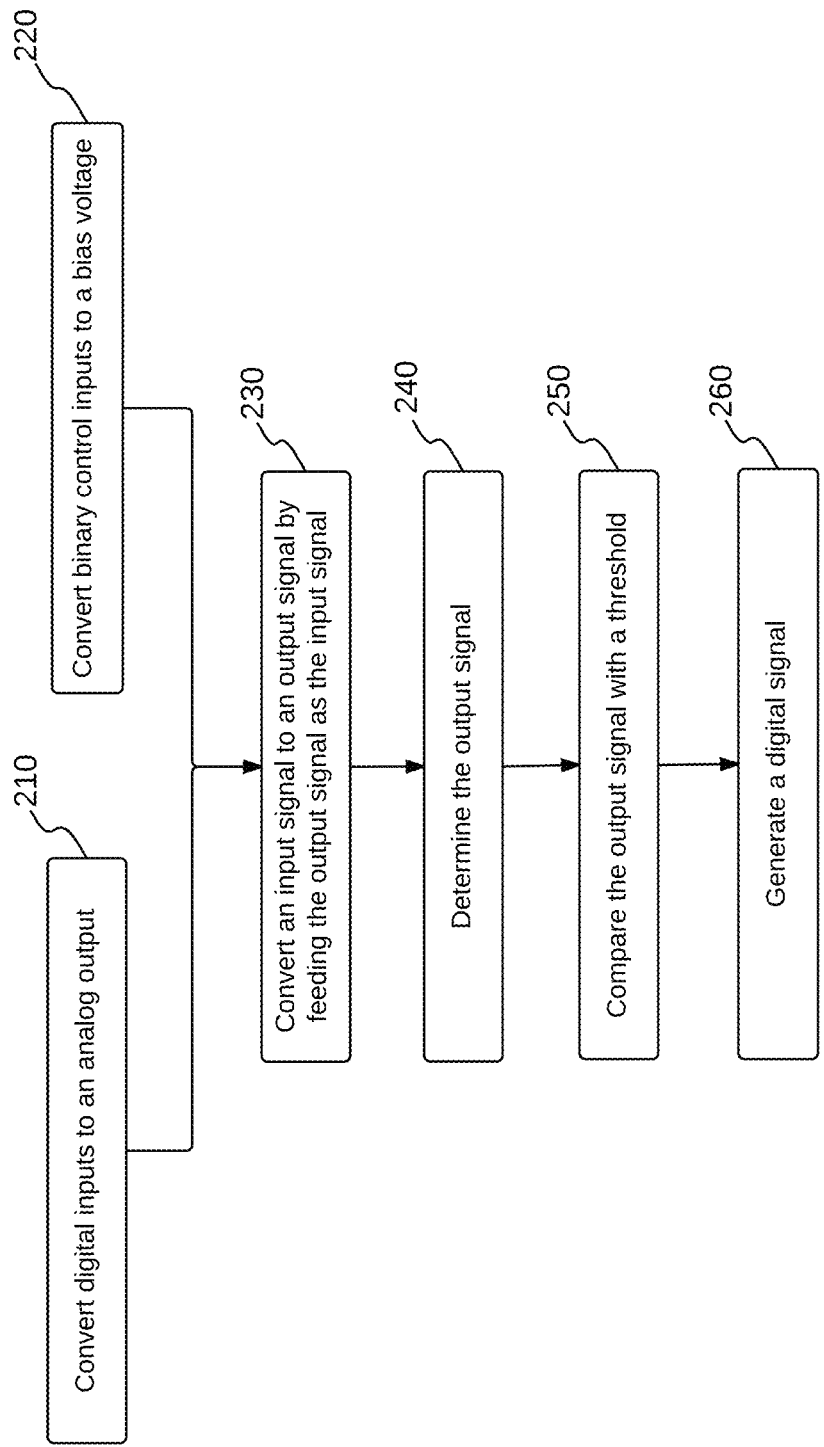
FIG. 2 is a flow diagram that can be performed in the chaos-based logic block illustrated in FIG. 1.

FIG. 2 illustrates a process of chaos computing by the chaos-based logic block 100. For example, at step 210, an encoding circuit block can convert a plurality of digital inputs to an analog output. The encoding circuit block can initialize at least one chaotic circuit block with the analog output. The analog output can be a weighted sum of the plurality of digital inputs. The plurality of digital inputs can comprise at least one data input and at least one control input. At step 220, a bias voltage generating circuit block can convert a plurality of binary control inputs to a bias voltage. The bias voltage is fed to at least one chaotic circuit block.

At step 230, at least one chaotic circuit block can convert an input signal to an output signal by feeding the output signal to at least one chaotic circuit as the input signal at each iteration. Specifically, at least one chaotic circuit block can form an iterated chaotic system, which maps the input signal to the output signal and feeds the output signal back to the same chaotic circuit block.

In addition, at least one chaotic circuit block can build any number of interconnected or chained chaotic circuit blocks. For example, a first and second chaotic circuit blocks can be interconnected each other to perform two parallel computations at each step. The second chaotic circuit block can be the same to the first chaotic circuit blocks, but it can be different, too. In an embodiment, at least one chaotic circuit block can form a lattice of multiple chaotic circuit blocks to perform a high performance mode or a robust mode. In the high performance mode, each of the multiple chaotic circuit blocks becomes independent and uncoupled. The multiple chaotic circuit blocks can operate each other in parallel, thereby implementing different operations. In the robust mode, as noise level increases for certain reasons, each of the multiple chaotic circuit blocks gets coupled each other and operates together to implement a robust computation.

At step 240, at least one chaotic circuit block can determine the output signal by performing circuit operations. The circuit operation can comprise at least one of: (1) changing at least one control input of the encoding circuit block; (2) changing a number of each iteration at the at least one chaotic circuit block; or (3) changing the plurality of binary control inputs at the bias voltage generating circuit block. In other words, at least one chaotic circuit block can be programmed by: (1) changing the shape of the nonlinear map that the chaotic circuit blocks implement by tuning the bias voltage; (2) shifting the encoded analog values that are feed to the first circuit chaotic block; (3) changing the evolution time that the at least one chaotic circuit block iterates, or (4) any combination of the above three methods.

As explained above, by changing at least one control input of the encoding circuit block, at least one chaotic circuit block can perform different types of operations. Specifically, at least one control input can change the analog output of the encoding circuit block. At least one chaotic circuit block can be initialized with the changed analog output. By changing the initial condition, a chaotic evolution of at least one chaotic circuit block can be changed and as a result, it can produce different types of operations.

At least one chaotic circuit block can be programmed with a bias voltage to perform desired computations. For example, a simple electronic circuit to generate the bias voltage maps two binary control inputs to a bias voltage. That is, the two control inputs can change the value of bias voltage, which is fed to at least one chaotic circuit block. Thus, with changes in the bias voltage, at least one chaotic circuit block can produce different output signals.

After at least one chaotic circuit block is initialized and the bias voltage is applied to at least one chaotic circuit block, at least one chaotic circuit block can evolve. Assuming that at least one chaotic circuit block is formed with two interconnected chaotic circuit blocks, the two interconnected chaotic circuit blocks produce two outputs at each iteration. These two outputs can be different from each other and change after the two interconnected chaotic circuit blocks iterate. As a result, the two interconnected circuit blocks can implement two parallel operations at each iteration. The two interconnected circuit blocks can also implement different functions at each iteration. This evolution time of the circuit block can be controlled to program at least one chaotic circuit block to implement the desired operations.

At step 250, a threshold circuit block can compare the output signal of at least one chaotic circuit block with a predetermined threshold and at step 260 generate a digital signal such as "0" or "1". For example, if the output signal of at least one chaotic circuit block is less than the predetermined threshold value, the threshold circuit block 130 can assign a digital signal "1" for the output signals. If the output signal of at least one chaotic circuit block 120 is higher than the predetermined threshold value, the threshold circuit block 130 can assign a digital signal "0" for the output signals.

Figure 3:
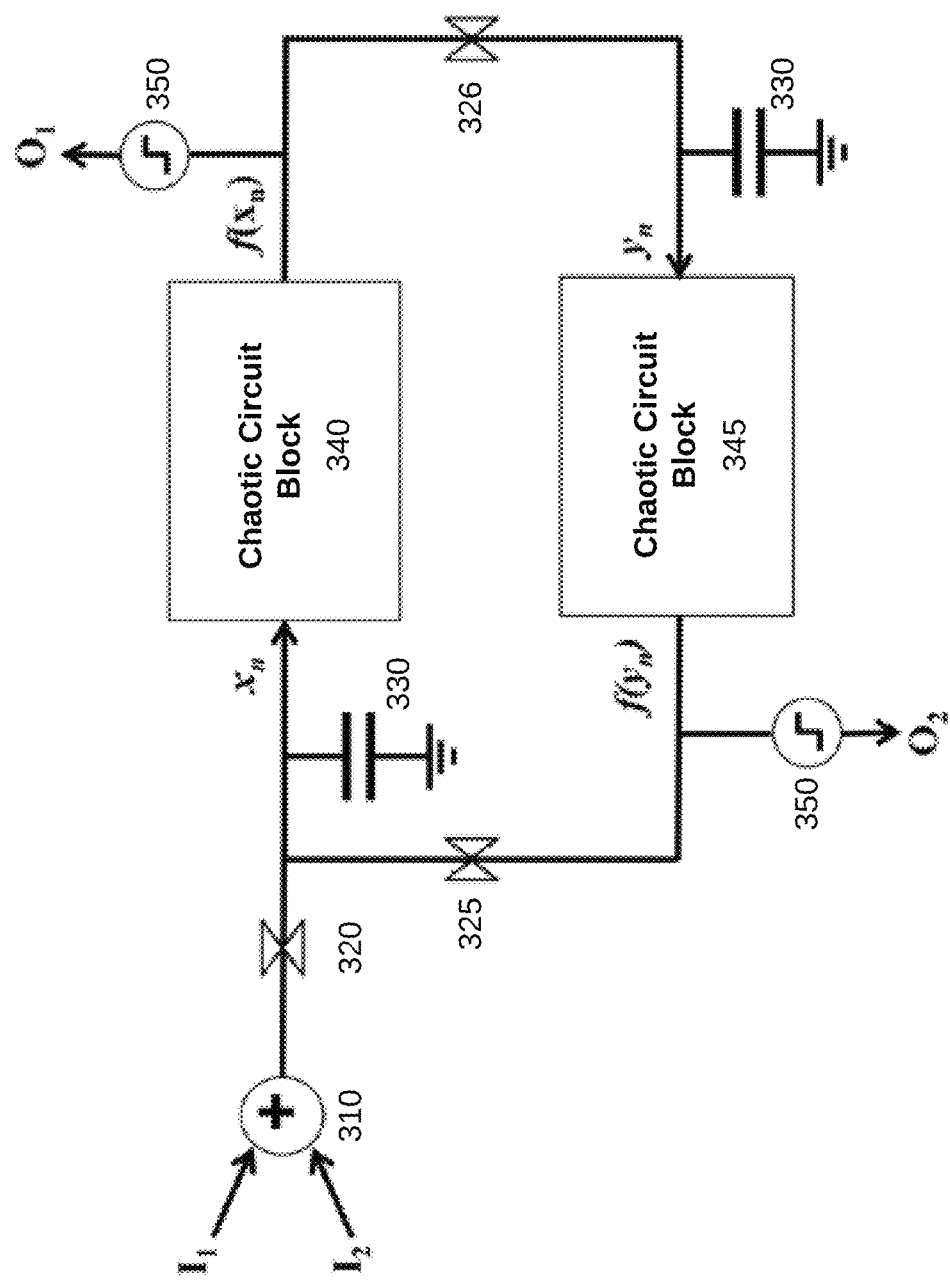
FIG. 3 is a circuit diagram illustrating two interconnected chaotic circuit blocks for chaos computing in accordance with an embodiment.

FIG. 3 illustrates two interconnected chaotic circuit blocks 340 for chaos computing in accordance with an embodiment. In the two chaotic circuit blocks 340 and 345, an output of one chaotic circuit block can be used as an input of the other chaotic circuit block. There can be two switches 325 and 326 between the two chaotic circuit blocks 340 and 345 to regulate the flow of the signal. When the first switch 325 is open, the second switch 326 is closed, and vice versa. This may allow a stable flow of signals between the two chaotic circuit blocks 340 and 345. The result can be two chaotic orbits, one from the first chaotic circuit block 340, and the second from the second chaotic circuit block 345. Because the chaotic evolutions can perform logical computation and there are two chaotic evolutions, $f(x_n)$ and $f(y_n)$, the two chaotic circuit blocks 340 and 345 can perform two parallel computations at each step.

It is noted that the circuit producing chaotic evolution by feeding the output of a circuit into itself can be used as the core of the chaos computing system. However, feeding the output of a single chaotic circuit back into itself may require additional circuitries and some extra delay time. These extra circuitries and delay time can create overhead. To reduce this limitation, an architecture of two-chained chaotic circuit blocks described in FIG. 3 can be utilized. In this two-chained architecture, the second chaotic circuit block 345, which is used as a delay element, can be used as an additional parallel computing element. This means that the two chained chaotic circuit blocks can utilize available resources more efficiently than a single chaotic circuit block. The two chained chaotic circuit blocks can include temporary storage elements 330 to hold the input voltage level for the chaotic circuit blocks 340 and 345. The gate capacitance of transistors that are used to build a chaotic circuit block can be utilized as the temporary storage element 330. In an embodiment, an additional capacitor can also be used to store the temporary analog value.

The types of two chaotic circuit block 340 and 345 can be the same or different. The computing scheme can still work even if they are not the same type of circuit block.

The main idea of chaos computing is to map the desired computation task to the intrinsic dynamics of the system. In order to perform the desired computation task, the input data can be encoded as the initial condition of the first chaotic circuit block 340. Once the first chaotic circuit block 340 is initialized, the chaotic circuit can evolve and the outputs of the computation from the dynamical states of the chaotic circuit blocks 340 and 345 can be decoded at an output production circuit block 350.

Figure 4A:
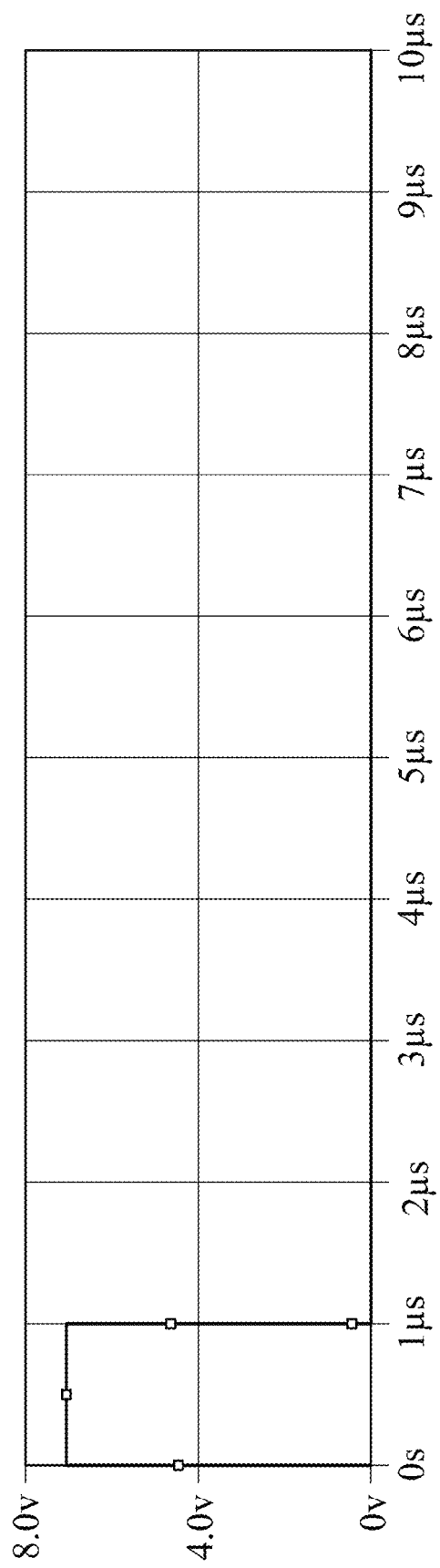
FIGS. 4A-C are a series of timing graphs illustrating clock signals implemented by switches illustrated in FIG. 3.
Figure 4B:
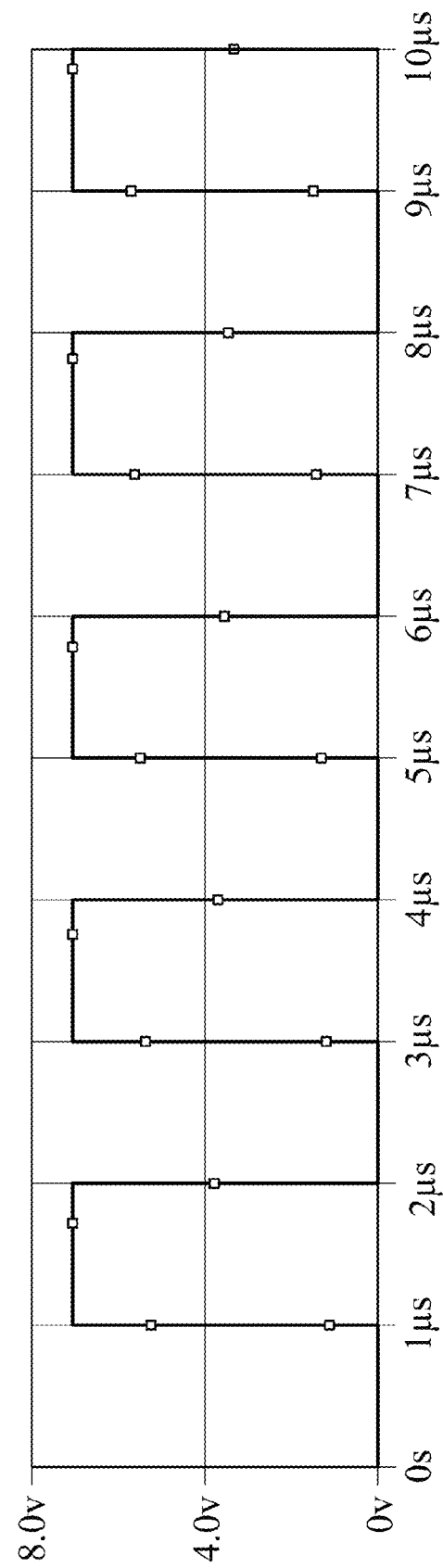
Figure 4C:
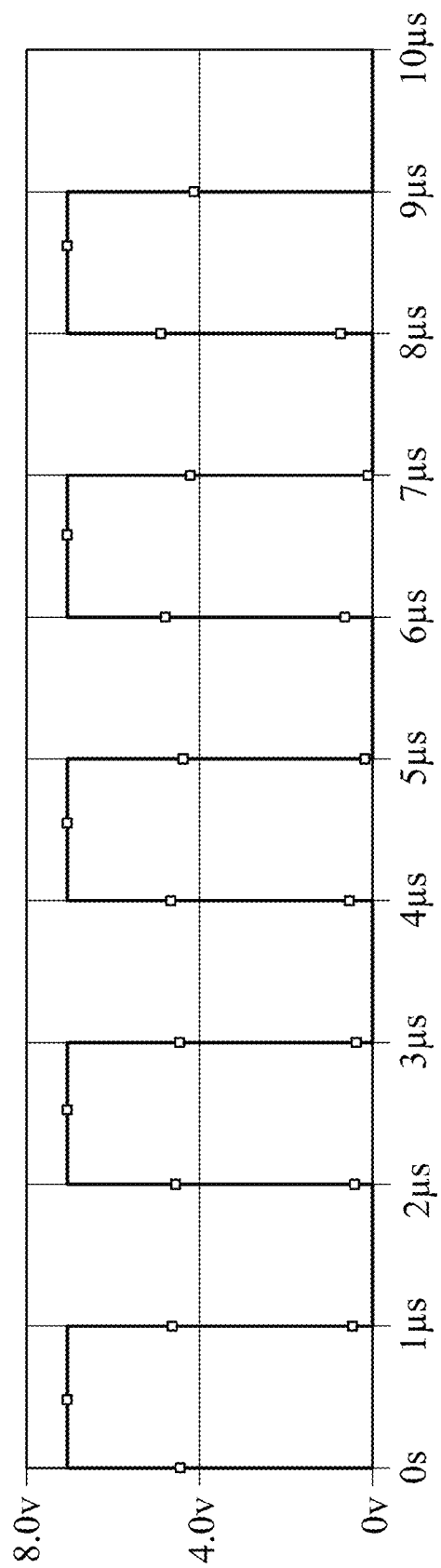

The first chaotic circuit block 340 can be initialized to a weighted sum of data inputs I1 and I2 by a summing circuit 310. During this process, switches 320 and 326 are closed and switch 325 is open. This forms the encoding part of chaotic computing by the two chaotic circuit blocks 340 and 345. After initializing the chaotic circuit block 340, switch 320 opens and remains open during the rest of the computation, whereas switches 325 and 326 close and open alternatively, thereby producing a chaotic evolution. FIGS. 4A-C illustrates clock signals implemented by the switches 320, 325, and 326.

The output production circuit blocks 350 in FIG. 3 can decode the two binary outputs from the output of each chaotic circuit block 340 and 345. For example, the state space of a chaotic circuit block is divided into two parts, and assigned to a symbol, 0 or 1. The output of computations at iteration i of the chaotic circuit block can be determined based on at which part $f(x_i)$ and $f(y_i)$ are located.

Figure 5:
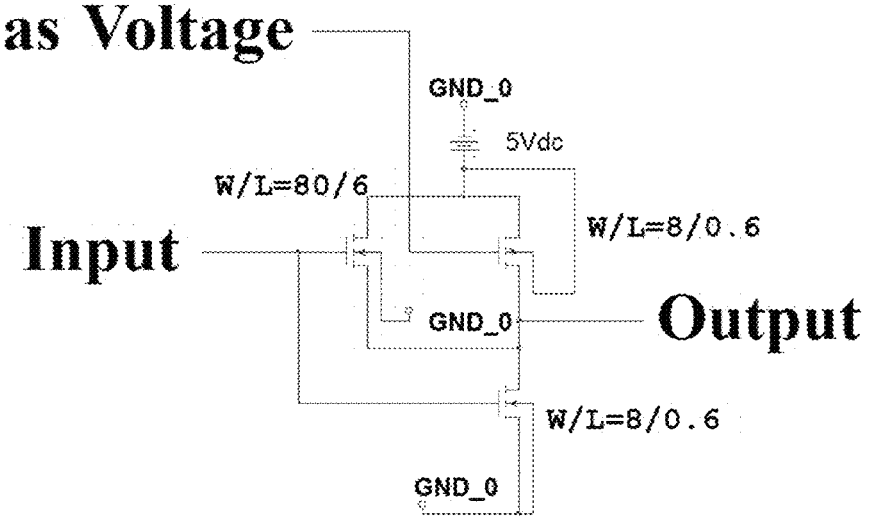
FIG. 5 is a circuit diagram illustrating a three-transistor implementation of a chaotic circuit block in accordance with an embodiment.
Figure 6:
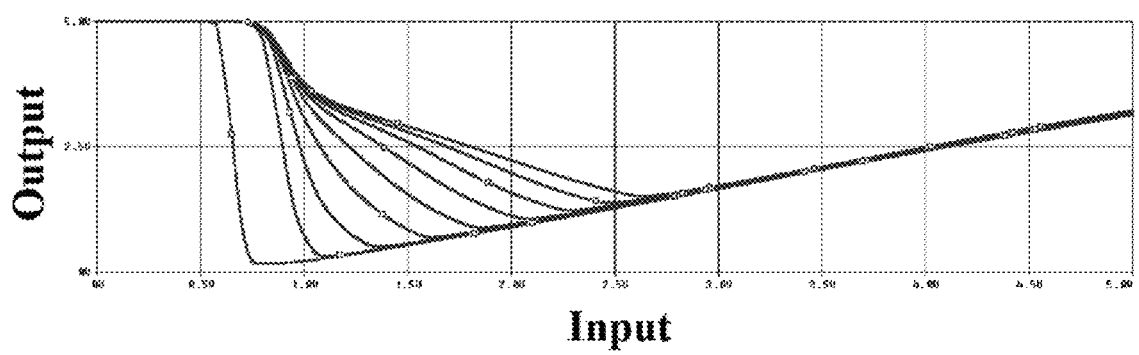
FIG. 6 is a graph illustrating output of the chaotic circuit block illustrated in FIG. 5 for different inputs and bias voltages.

FIG. 5 illustrates a three-transistor implementation of a chaotic circuit block described in FIG. 3. FIG. 6 illustrates output of the chaotic circuit block in FIG. 5 which is plotted against different input values. To design the chaotic circuits, 0.6 µm CMOS technology and On-Semi C5 process are used in FIG. 5. The chaotic map f of the chaotic circuit block can be any circuit, and can have any implementation. For example, a simple 1-D map with three transistors is used as shown in FIG. 5. The values of the transistors can be as follows: M1=8 µm/0.6 µm, M2=80 µm/0.6 µm, and M3=8 µm/0.6 µm. The output of the chaotic circuit block for different input values is plotted in FIG. 6 for different values of bias voltage.

For analog switches, a simple n-mos transistor, which is normally called an n-mos transmission gate, or simply pass transistor, may suffice. A CMOS transmission gate may also be used. The CMOS transmission gage consists of an n-mos and p-mos coupled together, but a simple n-mos transmission gate can be enough. However, in the case of using a simple n-mos transmission gate, the voltage level of the transmitted signals needs to be less than the voltage level of the clock signal that drives the n-mos gate, and the difference in voltage level needs to be at least threshold voltage of the transistor. This is basically a trade-off between voltage levels or the number of transistors. A circuit with fewer transistors may require a higher voltage level for clocking, but a larger circuit may require one voltage level for the entire circuit. In this circuit, single transistor transmission gates and 7-volt clocks are used. The values of n-mos transistors used as transmission gates are W/L=2 µm/0.6 µm.

Figure 7:
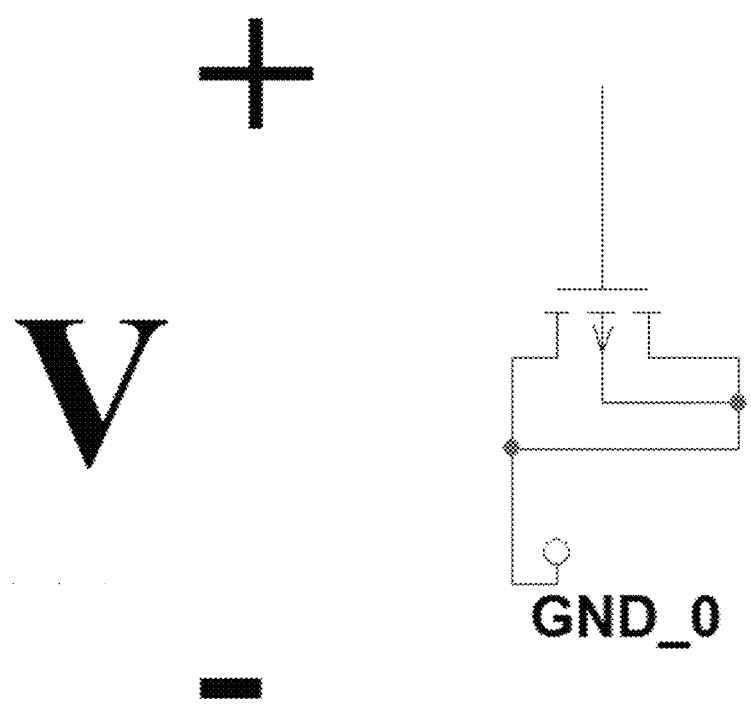
FIG. 7 is a circuit diagram illustrating a transistor that is biased to operate as a capacitor in accordance with an embodiment.

FIG. 7 illustrates a transistor that operates as a capacitor in accordance with an embodiment. Input capacitance of transistors of the chaotic circuit can be used to temporarily store the input signal. The chaotic circuit may require a very high precision in sampling and holding. Thus, in addition to this capacitance element, an extra p-mos transistor that is biased to operate as a capacitor can be used. FIG. 7 illustrates the extra p-mos transistor operating as a capacitor. In FIG. 7, drain, source, and body of this p-mos transistor are all grounded, and the gate terminal is used as the capacitor. The size of this p-mos transistor is W/L=40 µm/80 µm. Alternatively, an n-mos transistor can be used instead of the p-mos transistor.

Figure 8:
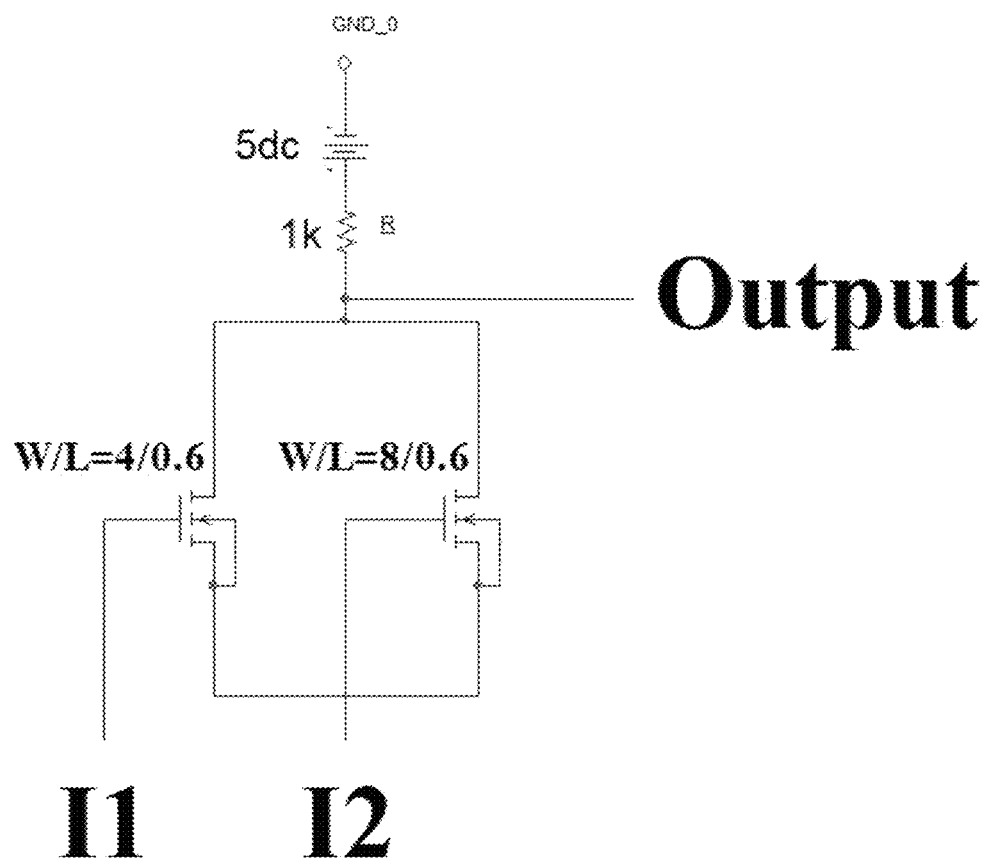
FIG. 8 is a circuit diagram illustrating an encoding circuit block for converting binary data inputs to an analog output value in accordance with an embodiment.

FIG. 8 illustrates an encoding circuit block for converting binary data inputs to an analog output value in accordance with an embodiment. For example, the encoding circuit block can map two binary inputs to a voltage value. Two lower transistors shown in FIG. 8 can be turned on or off based on the value of the binary input. The two lower transistors may have different W/L ratios; as a result (1, 0) and (0, 1) inputs can produce different output voltage.

The encoding circuit block can a digital to analog convertor, but it is not limited to an exact, perfect digital to analog convertor. Any encoder that maps different data inputs to unique and distinct values (with enough distance between the produced values) can be used to encode the input data as the initial condition of the chaotic circuit block. Once the chaotic circuit block is initialized, it can take care of the rest. These distinct initial conditions under the chaotic dynamics can produce distinct and different orbits that results in different outputs.

Figure 9:
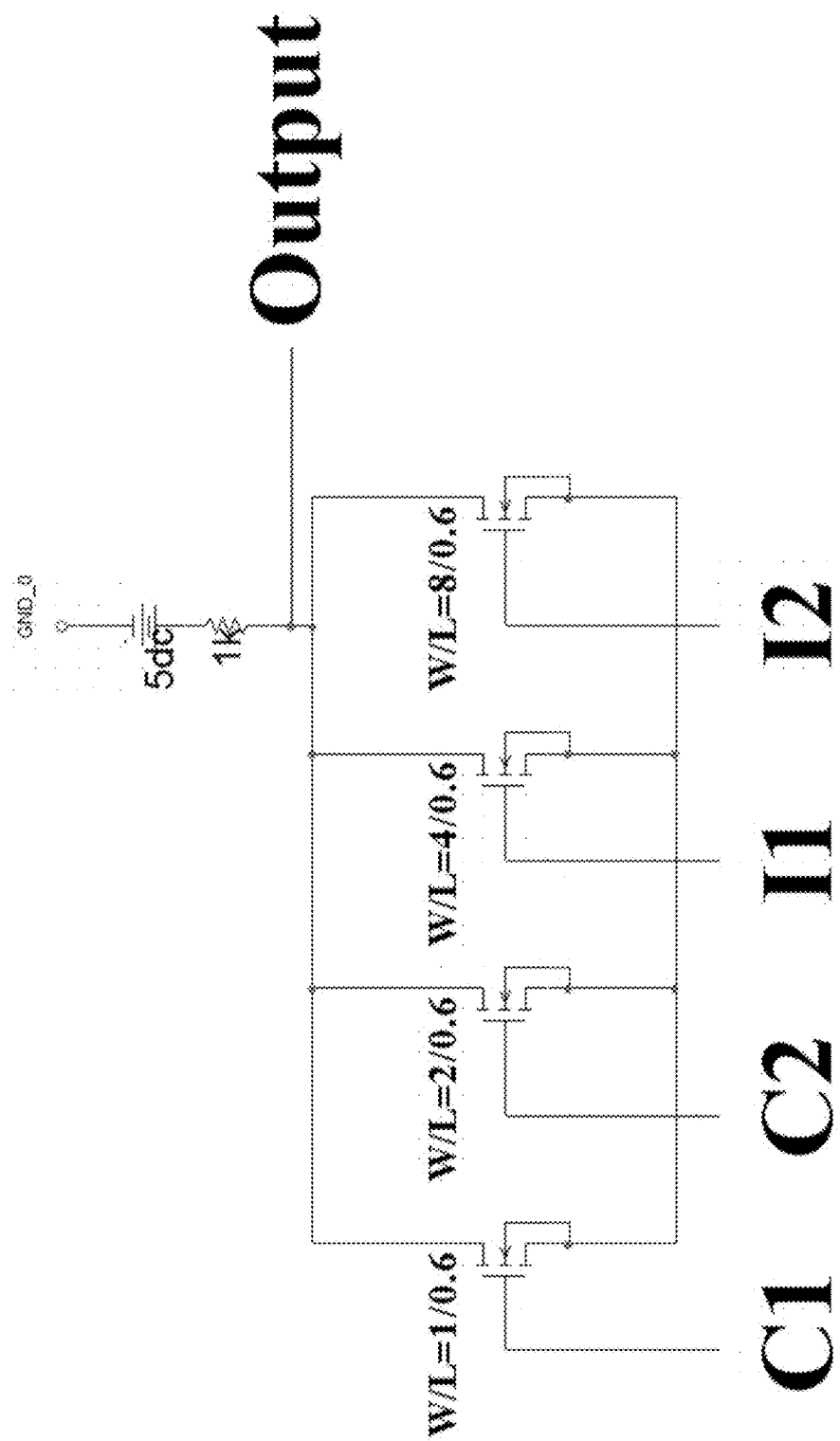
FIG. 9 is a circuit diagram illustrating another encoding circuit block with an additional line for control inputs in accordance with an embodiment.

FIG. 9 illustrates an encoding circuit block with two additional lines for control inputs in accordance with an embodiment. As described above, a few additional control inputs can be added to the encoding circuit block. These control inputs can change the output of the encoding circuit block, where the output is used as an initial condition of the chaotic circuit block. As the initial condition of the chaotic circuit block changes, the chaotic evolution of the chaotic circuit block changes. As a result, the chaotic circuit block can produce different types of operations. In FIG. 9, two additional input lines, C1 and C2, can be used to control the circuit operation.

Figure 10:
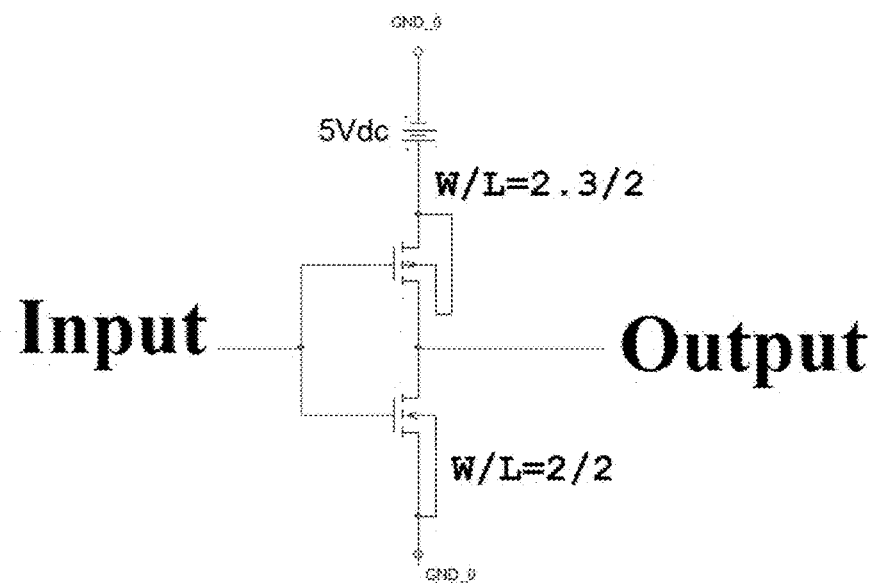
FIG. 10 is a circuit diagram illustrating a threshold circuit block to produce a binary output from an analog input in accordance with an embodiment.
Figure 11:
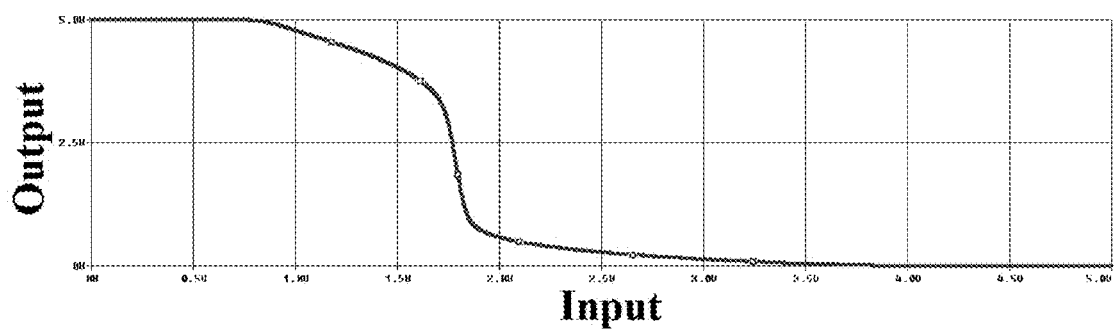
FIG. 11 is a graph illustrating outputs of the threshold circuit illustrated in FIG. 10.

FIG. 10 illustrates a threshold circuit block to produce a binary output from an analog input in accordance with an embodiment. FIG. 11 illustrates output of the threshold circuit in FIG. 10. To assign a symbol to the output state of a map, the state space of the map can be divided into two parts, and each part can be assigned to a symbol 0 or 1. The threshold circuit block can produce symbol 0 or 1 based on at which part the output of the map is located. This threshold circuit block can comprise a simple inverter circuit to produce the symbol. In FIG. 10, a two-transistor inverter circuit is illustrated as the threshold circuit block and its output for different input values is plotted in FIG. 11.

The inverter circuit in FIG. 10 can assign symbol "1" for input values in [0,1.8) and symbol "0" for input values in (1.8, 5]. "1.8" is the threshold value to produce the output symbol. There can be two reasons why 1.8 is chosen for the threshold value. First, it is mostly dynamically oriented. Normally, the critical point of the maps is preferably selected as the threshold value. As illustrated in FIG. 6, this critical value depends on the bias voltage of the chaotic circuit block. And 1.8 is about the average of different critical values of the maps for different bias values. Second, the threshold value can determine the probability of obtaining 0 and 1 as the outputs. Thus, the threshold value needs to be chosen for the probability of obtaining 0 and 1 to be equal. In other words, the orbits of the chaotic system spend the same amount of time at each side of the threshold value. This can insure that the implemented logic block can implement all digital functions efficiently and it is not biased to implement functions that produce just is or Os.

As explained above, the inverter circuit can map the inputs values that are in the lower half of the interval, to 5.0V which represents logic 1, and the upper half to 0V which represent logic 0. Specifically, the output transits from 1 to 0 in the middle of the input interval around 1.8V. Around 1.8V, it does not produce clean symbol 0 or 1. In chaos computing, the orbits that are too close to the boundaries are not generally used because it is not very robust against noise and the output symbol may not be a clean 0 or 1 symbol. Here, 1.8 is the orbit that is too close to the boundaries. In order to reduce this limitation, two cascaded inverters may be used for the threshold circuit block.

Figure 12:
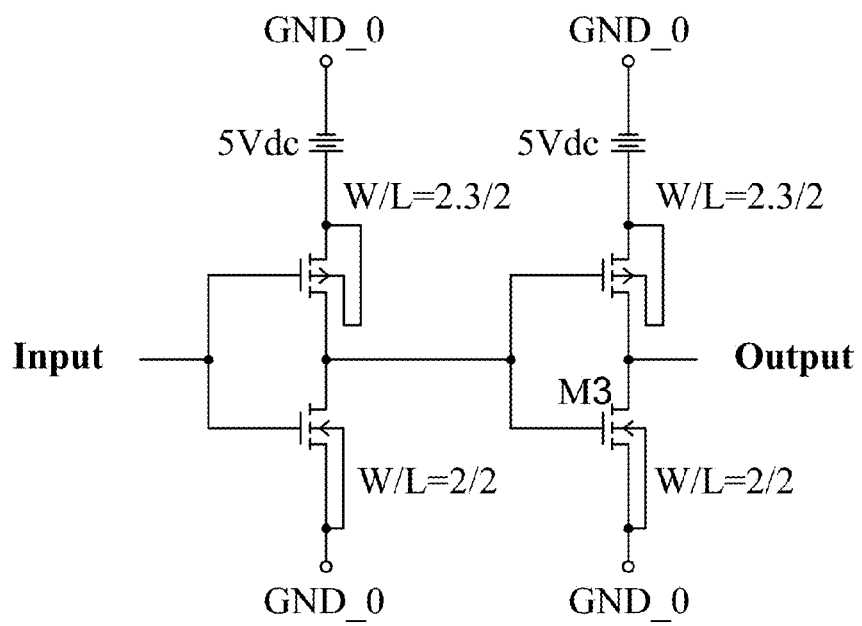
FIG. 12 is a circuit diagram illustrating two cascaded threshold circuit blocks to produce a binary output from an analog input in accordance with an embodiment.
Figure 13:
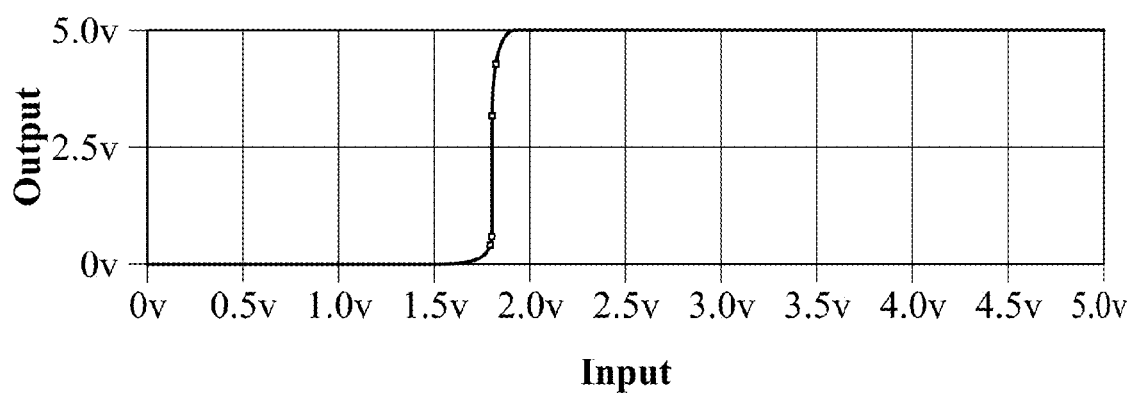
FIG. 13 is a graph illustrating outputs of the two cascaded threshold circuit illustrated in FIG. 12.

FIG. 12 illustrates two cascaded threshold circuit blocks to produce binary output from an analog input in accordance with an embodiment. FIG. 13 illustrates an output of the two cascaded threshold circuit illustrated in FIG. 12. The two cascaded threshold circuit blocks can comprise two cascaded CMOS inverter gates to produce an enhanced binary output from an analog input. As illustrated in FIG. 13, the output of the cascaded inverter circuits is plotted versus different input values. The two cascaded inverter circuits can assigns symbol 0 to [0,1.8) and symbol "1" for input values in (1.8, 5]. In other words, the two cascaded inverter circuits can map the input values that are in the lower half of the interval to 0V which represents logic 0, and the upper half of the interval to 5V which represents logic 1. This means that the two cascaded inverter circuits have an enhanced performance and transition at the threshold value, 1.8V.

Figure 14:
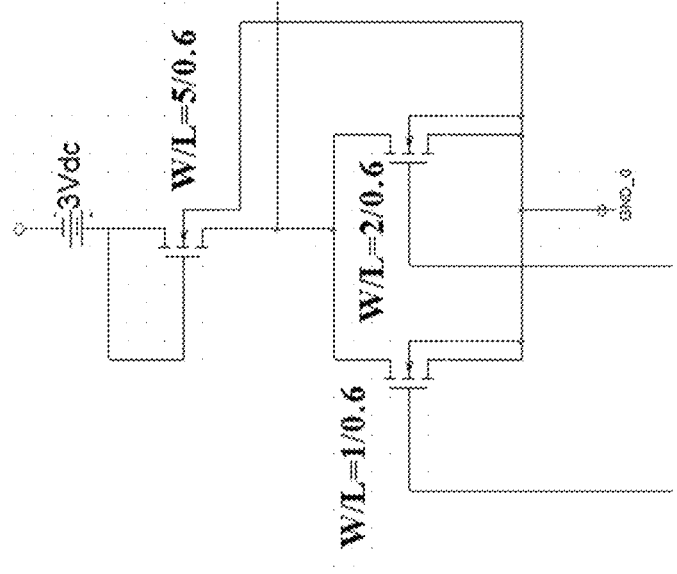
FIG. 14 is a circuit diagram illustrating a bias voltage generating circuit block for converting two binary control inputs to a bias voltage in accordance with an embodiment.

FIG. 14 is a circuit diagram illustrating a bias voltage generating circuit block for converting two binary control inputs to a bias voltage in accordance with an embodiment. As explained above, the bias voltage can change the shape of the map and as a result, it can be used to tune and program the chaotic circuit block to perform a desired computation. As illustrated in FIG. 14, the bias voltage generating circuit block can comprise a very simple circuit that maps two binary control inputs to a bias voltage. This bias voltage can be fed to the chaotic circuit blocks.

Figure 15:
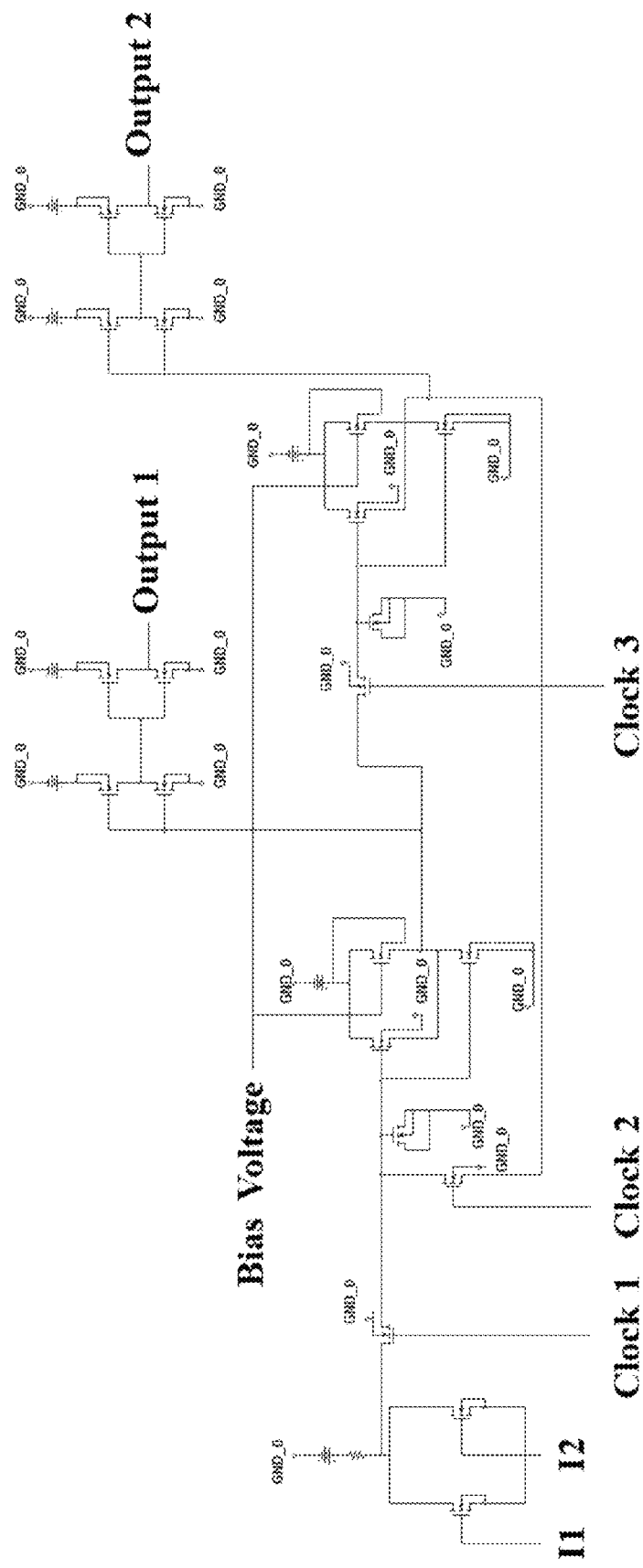
FIG. 15 is a circuit diagram illustrating a chaos based logic design that is composed of the circuit blocks illustrated in FIGS. 5, 8, and 12 in accordance with an embodiment.

FIG. 15 illustrates a chaos based logic design that is composed of the circuit blocks illustrated in FIGS. 5, 8, and 12 in accordance with an embodiment. Different combinations of data inputs can initialize the first chaotic circuit block to different values, and then the first and second chaotic circuit blocks evolve. This chaos based logic design can implement a two-input, one-output digital function. However, it can be programmed to implement different functions by changing initial condition, parameter turning, and evolution time.

For example, a few additional control inputs can be added to the input encoding map circuit, depicted in FIG. 8. These control inputs can bias and change the output of the encoding circuit, which is used as an initial condition of the chaotic map. By changing the initial condition of the chaotic map, its chaotic evolution can change, and as a result it can produce different types of operations. FIG. 9 shows the encoding map with two additional input lines, C1 and C2, which can be used to control the circuit operation.

As described above, there can be a bias voltage to chaotic maps. This bias voltage can also change the shape of the map, and as a result it can be used to tune and program the circuit to perform the desired computation. FIG. 14 depicts a simple circuit that can map two binary control inputs to a bias voltage. This bias voltage can be fed to the circuit depicted in FIG. 15.

In an embodiment, after initializing the chaotic circuit blocks using digital data inputs and additional digital control inputs if they are used, and applying a bias voltage based the given control inputs, for example C3 and C4 in FIG. 14, the chaotic circuit blocks can evolve. As the chaotic circuit blocks evolve, at each iteration (i.e. one pulse of clocks signals for switches 325 or 326 in FIG. 3), the chaotic circuit blocks can produce two outputs. These two outputs can be different from each other, and they normally change after each iteration. As a result, the chaotic circuit blocks can implement two parallel operations at each iteration, and at different iterations it implements different functions. This evolution time of the circuit can be used as a handle to program the chaotic circuit blocks to implement the desired operation. It is noted that the iteration number cannot be arbitrarily large; rather the noise and noise effects can limit the iteration number.

Figure 16:
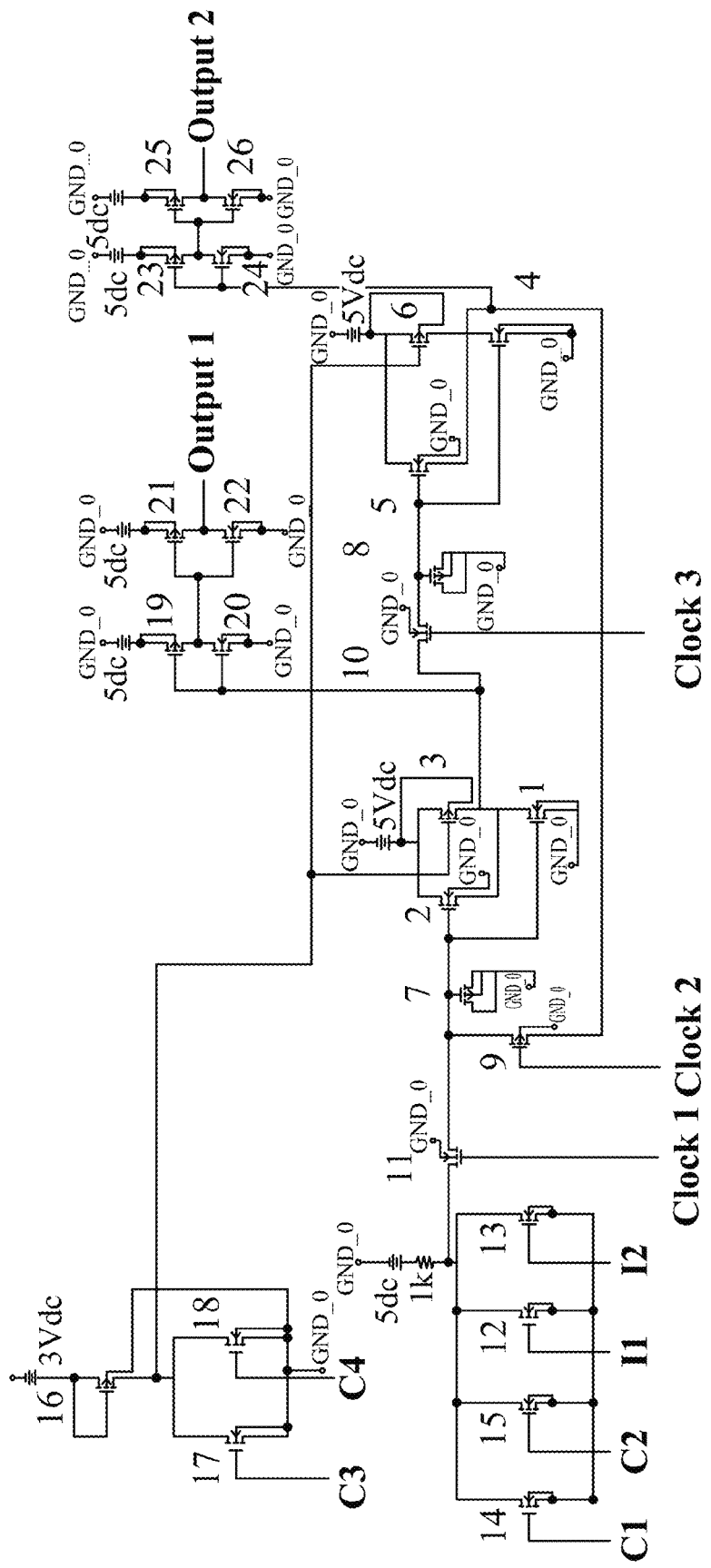
FIG. 16 is a circuit diagram illustrating a programmable chaos based logic design that is composed of the circuit blocks illustrated in FIGS. 5, 9, 12, and 14 in accordance with an embodiment.

FIG. 16 illustrates a programmable chaos based logic design by control inputs in accordance with an embodiment. The programmable chaos based logic design can be composed of the circuit blocks illustrated in FIGS. 5, 9, 12, and 14. This logic block can be programmed by 4 binary control inputs, C1, C2, C3, and C4. Table 1 illustrates the list of transistors used in this circuit and their sizes.

TABLE 1

| Transistor | Type | W/L (μm/μm) |
|---|---|---|
| 1, 4 | NMOS | 8/0.6 |
| 2, 5 | NMOS | 80/0.6 |
| 3, 6 | PMOS | 8/0.6 |
| 7, 8 | PMOS | 80/40 |
| 9, 10, 11 | NMOS | 2/0.6 |
| 12 | NMOS | 4/0.6 |
| 13 | NMOS | 8/0.6 |
| 14 | NMOS | 1/0.6 |
| 15 | NMOS | 2/0.6 |
| 16 | NMOS | 5/0.6 |
| 15 | NMOS | 1/0.6 |
| 18 | NMOS | 2/0.6 |
| 19, 21, 23, 25 | PMOS | 2.3/2 |
| 20, 22, 24, 26 | NMOS | 2/2 |

Table 2 illustrates the simulation results. In Table 2, each couple contains the label of two functions that the circuit implements in parallel. Functions are labeled by 0, . . . , 15 based on their outputs.

TABLE 2

| Iteration | Functions |
|---|---|
| 1 | (13, 11), (13, 10), (13, 14), (15, 12), (13, 11), (13, 10), (13, 14), (13, 14), (13, 11), (13, 10), (13, 10), (13, 14), (13, 11), (13, 10), (13, 10), (13, 10) |
| 2 | (11, 4), (10, 7), (14, 1), (12, 3), (11, 4), (10, 7), (14, 1), (14, 1), (11, 4), (10, 7), (10, 1), (14, 1), (11, 4), (10, 4), (10, 3), (10, 3), |
| 3 | (4, 11), (7, 8), (1, 14), (3, 12), (4, 11), (7, 8), (1, 14), (1, 14), (4, 11), (7, 8), (1, 4), (1, 7), (4, 15), (4, 9), (3, 0), (3, 5), |
| 4 | (11, 4), (8, 7), (14, 1), (12, 3), (11, 4), (8, 7), (14, 1), (14, 1), (11, 4), (8, 7), (4, 0), (7, 8), (15, 1), (9, 2), (0, 12), (5, 8), |
| 5 | (4, 11), (7, 8), (1, 14), (3, 12), (4, 11), (7, 9), (1, 14), (1, 14), (4, 11), (7, 12), (0, 14), (8, 5), (1, 6), (2, 15), (12, 4), (8, 15), |
| 6 | (11, 4), (8, 7), (14, 1), (12, 3), (11, 1), (9, 6), (14, 1), (14, 3), (11, 4), (12, 2), (14, 4), (5, 9), (6, 0), (15, 12), (4, 1), (15, 3), |
| 7 | (4, 11), (7, 8), (1, 14), (3, 13), (1, 14), (6, 11), (1, 10), (3, 12), (4, 11), (2, 12), (4, 10), (9, 14), (0, 13), (12, 2), (1, 15), (3, 12), |
| 8 | (11, 12), (8, 7), (14, 1), (13, 2), (14, 9), (11, 4), (10, 7), (12, 3), (11, 12), (12, 7), (10, 12), (14, 5), (13, 12), (2, 14), (15, 4), (12, 3), |
| 9 | (12, 3), (7, 8), (1, 15), (2, 13), (9, 6), (4, 11), (7, 8), (3, 12), (12, 6), (7, 8), (12, 7), (5, 11), (12, 2), (14, 0), (4, 10), (3, 15), |

Each row of Table 2 lists the functions that can be observed at each iteration of the chaotic circuit blocks illustrated in FIG. 16. There can be 16 different binary, two-input, one-output functions. These functions are labeled with 0, 1, . . . , 15, based on the outputs they produce. For example, the digital function that produces all 0 outputs is function 0. The digital function that produces all 1 outputs is function 15, and the rest are in between.

Furthermore, at each iteration, the disclosed chaotic circuit in FIG. 16 can implement two functions at parallel. That is why the results are reported as couples. For example, when (3,7) is written, this means that the first chaotic circuit block implements the function 3, and the second chaotic circuit block implements the function 7.

It is also noticed that there are 16 couples at each row. The reason is that the simulated circuit has 4 different digital control inputs, C0 and C1 to change the initial condition of the maps, and C3 and C4 to set the bias voltage. Therefore, these 4 binary digital control inputs can program the disclosed chaotic circuit to 16 different conditions, where at each condition the circuit can produce one couple of functions at parallel. At each row, the first couple of functions can be obtained when four control inputs, C1, C2, C3, C4, are all 0, the last couple can be obtained when all four control inputs, C1, C2, C3, C4, are 1, and the rest are sorted in between.

It is observed that at very first few iterations of the circuit, the circuit implements the same functions repeatedly with different control inputs and fails to implement a wide range of functions. This result is very predictable and can be simply explained. In a chaotic system, nearby orbits need some minimum evolution time so that they can diverge from each other. When the iteration number is very low, these nearby orbits have not diverged from each other yet, and therefore the logic block can behave the same and implement the same type of functions even though different control input values for C1 and C2 are applied. Similarly, when control inputs C3 and C4 change the shape of the chaotic map as illustrated in FIG. 6, these different chaotic maps are still similar enough to implement the same functions at very first few iterations. However, after these initial iterations, the chaotic maps can behave totally different and therefore they can implement different functions.

While the chaos-based logic block for chaos computing has been described in connection with the various embodiments of the various figures, it is to be understood that other similar embodiments may be used or modifications and additions may be made to the described embodiments of the chaos-based logic block without deviating therefrom. For example, one skilled in the art will recognize that the chaos-based logic block for chaos computing as described in the instant application may apply to any electrical device such as SSI, MSI, VLSI, ULSI, WSI, SOC and 3D-IC, or the like. Therefore, the chaos-based logic block described herein should not be limited to any single embodiment, but rather should be constructed in breadth and scope in accordance with the appended claims.

What is claimed:

1. A chaos-based logic block for chaos computing, comprising:
    an encoding circuit block converting a plurality of digital inputs to an analog output, the plurality of digital inputs comprising at least one data input and at least one control input;
    at least one chaotic circuit block coupled to the encoding circuit block, the at least one chaotic circuit block is configured to iterate converting an input signal to an output signal by feeding the output signal to the at least one chaotic circuit as the input signal at each iteration;
    a bias voltage generating circuit block coupled to the at least one chaotic circuit block, converting a plurality of binary control inputs to a bias voltage; and
    a threshold circuit block coupled to the at least one chaotic circuit block, comparing the output signal with a predetermined threshold to generate a digital signal.

2. The chaos-based logic block of the claim 1, wherein the at least one chaotic circuit block is initialized by the analog output.

3. The chaos-based logic block of the claim 1, wherein the at least one chaotic circuit block receives the bias voltage that is indicative of direct current.

4. The chaos-based logic block of the claim 1, further comprising at least one switch coupled to the at least one chaotic circuit block, the at least one switch is configured to control the input signal at the at least one chaotic circuit block.

5. The chaos-based logic block of the claim 1, wherein each of the at least one switch alternately turns on and off at the each iteration.

6. A method for chaos computing, the method comprising:
    converting, at an encoding circuit block, a plurality of digital inputs to an analog output, the plurality of digital inputs comprising at least one data input and at least one control input;

converting, at a bias voltage generating circuit block, a plurality of binary control inputs to a bias voltage;

converting, by at least one chaotic circuit block, an input signal to an output signal by feeding the output signal to the at least one chaotic circuit as the input signal at each iteration;

determining the output signal by performing circuit operations comprising at least one of:
- changing the at least one control input of the encoding circuit block;
- changing a number of the each iteration at the at least one chaotic circuit block; or
- changing the plurality of binary control inputs at the bias voltage generating circuit block; and comparing, at a threshold circuit block, the output signal with a predetermined threshold to generate a digital signal.

7. The method of the claim 6, further comprising initializing the at least one chaotic circuit block with the analog output.

8. The method of the claim 6, further comprising receiving, at the at least one chaotic circuit block, the bias voltage that is indicative of direct current.

9. The method of the claim 6, further comprising controlling, by at least one switch coupled to the at least one chaotic circuit block, the input signal at the at least one chaotic circuit block.

10. The method of the claim 9, wherein each of the at least one switch alternately turns on and off at the each iteration.

\* \* \* \* \*